United States Patent [19]

Yokoyama

[11] Patent Number: 4,524,335
[45] Date of Patent: Jun. 18, 1985

[54] PULSE-WIDTH MODULATION CIRCUIT WITH CARRIER SIGNAL FREQUENCY CONTROL

[75] Inventor: Kenji Yokoyama, Hamamatsu, Japan
[73] Assignee: Nippon Gakki Seizo Kabushiki Kaisha, Japan
[21] Appl. No.: 473,777
[22] Filed: Mar. 10, 1983

[30] Foreign Application Priority Data

Mar. 13, 1982 [JP] Japan .................................. 57-40045
Jun. 29, 1982 [JP] Japan ............................ 57-97936[U]

[51] Int. Cl.³ .............................................. H03K 7/08
[52] U.S. Cl. ..................... 332/9 R; 375/22; 330/10
[58] Field of Search .......................... 332/9 R, 10, 15; 375/22; 330/10

[56] References Cited

U.S. PATENT DOCUMENTS 3,506,920 4/1970 Swanson ................................ 332/41
3,585,517 6/1971 Herbert ................................ 330/10
4,178,556 12/1979 Attwood ............................... 330/10

OTHER PUBLICATIONS

P. H. Pazov, "Pulse Modulator Provides Switched-Mode Amplification", Nov. 6, 1980, *Electronics*, vol. 53, No. 24, p. 131.

*Primary Examiner*—Eugene R. Laroche
*Assistant Examiner*—Robert J. Pascal
*Attorney, Agent, or Firm*—Kane, Dalsimer, Kane, Sullivan and Kurucz

[57] ABSTRACT

A pulse-width modulation circuit detects a signal level or amplitude of an audio signal by means of an absolute value detecting circuit. The detected level is applied to a control terminal of a voltage-controlled oscillator. The output of the voltage-controlled oscillator is used as a carrier signal of the pulse-width modulation circuit, and the frequency thereof is controlled in such a manner that the carrier frequency is lowered as the audio signal level increases. Higher order harmonics of the pulse-width-modulated output signal both at high and low modulation factors are made substantially the same in amount. Thus, a band width required for the circuit is remarkably narrowed, and improvement in distortion factor can be attained regardless of a low cost to manufacture.

6 Claims, 15 Drawing Figures

PULSE-WIDTH MODULATION CIRCUIT WITH CARRIER SIGNAL FREQUENCY CONTROL

BACKGROUND OF THE INVENTION

1. Field of the Invention

This invention relates to a pulse-width modulation circuit suitable for amplification of audio signals. and more particularly to the improvement of such a pulse-width modulation circuit.

2. Description of the Prior Art

As one type of audio amplifiers, a pulse-width modulation amplifier is known in the art, wherein an audio signal to be amplified is temporarily converted into a pulse signal by a pulse-width modulation circuit, and thereafter it is amplified in the form of a pulse signal in order to effectively attain a desired amplification. FIG. 1 shows a block diagram illustrating one example of such conventional amplifiers. In the figure, reference number 1 designates an input terminal to which an audio signal $e_a$ to be amplified is applied, and reference number 2 generally designates a pulse-width modulation circuit. The pulse-width modulation circuit 2 comprises an oscillator 2a and a modulation section $2_b$. The oscillator 2a generates a carrier signal $e_c$ having a constant frequency or period T, such as a square wave signal. The modulation section $2_b$ converts the audio signal $e_a$ into a pulse signal $e_p$ which has a duty factor corresponding to a signal level (amplitude) of the audio signal $e_a$. Pulse signals $e_p$ thus obtained are illustratively shown in FIGS. 2 (a) and (b). The pulse signal $e_p$ of FIG. 2 (a) shows a waveform which is obtained during the time when the audio signal level is zero, that is, at a 0% modulation factor, while the pulse signal $e_p$ of FIG. 2 (b) shows a waveform which is obtained during the time the audio signal level is high. Thus, the pulse signal $e_p$ changes its duty factor in accordance with the audio signal level. The pulse signal $e_p$ is then power-amplified at a pulse amplifier 3, and is thereafter applied to a low-pass filter 4 to remove therefrom signal components corresponding to the carrier signal $e_c$ and to obtain a demodulated signal having signal components corresponding only to audio signal $e_a$. Then, the demodulated signal is applied to a loudspeaker 5.

In the conventional pulse-width modulation circuit 2 described above, modulation is performed by employing a carrier signal $e_c$ whose constant frequency such as 500 kHz (or constant period such as 2 μsec) is determined depending upon the highest possible frequency of the audio signal $e_a$ such as 15 kHz. In order to amplify or transmit the waveform of the pulse signal $e_p$ with high fidelity, it is necessary for the associated circuitries to have a sufficient band width for performing such operation. For example, in the case of the pulse signal $e_p$ of FIG. 2 (a) at 0% modulation, since the pulse signal $e_p$ has low and high level durations both having the same time period T/2 and has a comparatively small amount of higher order frequency components, a moderate band width (such as several MHz for T=2 μsec) may suffice for the circuit operation. On the other hand, in the case of the pulse signal $e_p$ of FIG. 2 (b) resulted from a higher modulation, since the pulse signal $e_p$ has a high level duration with a longer time period and a low level duration with a shorter time period (or vice versa) and has a relatively large amount of higher order frequency components, a band width at least about ten times broader as that at a 0% modulation is required. As a result, if the conventional pulse-width modulation circuit is used, the pulse-width modulation circuit itself as well as the circuitries for amplifying or transmitting the pulse signal must be implemented with expensive high speed switching elements and with circuit arrangements having a broader band width. Thus, a very expensive and complicated circuit must have been employed. Furthermore, it is practically very difficult to realize such a wide band width so that the distortion factor is inavoidably degraded.

SUMMARY OF THE INVENTION

It is therefore a primary object of the invention to provide a pulse-width modulation circuit which can realize a low distortion and is inexpensive to manufacture.

With the above and other objects in view the present invention provides a pulse-width modulation circuit whose band width necessary for the operation is narrowed by varying the duty factor and frequency of an output pulse signal in accordance with the signal level of an input signal.

In a preferred example of the present invention which will be described hereinunder in detail, the pulse-width modulation circuit comprises: pulse-width modulation means in which a carrier signal is pulse-width-modulated by an input signal to generate a pulse signal having a duty factor corresponding to a level of the input signal; level detecting means for detecting a level corresponding to the level of the input signal; and carrier signal generating means for generating the carrier signal for the pulse-width modulation means, the carrier signal having a frequency which deviates in accordance with the detected level of the level detecting means, and which follows in such a manner that the frequency of the carrier signal is made lower as the detected level increases.

The foregoing and other objects, the features and the advantages of the present invention will be pointed out in, or apparent from, the following description of the preferred embodiments considered together with the accompanying drawings.

DETAILED DESCRIPTION OF THE PREFERRED EMBODIMENTS

Figure 1:
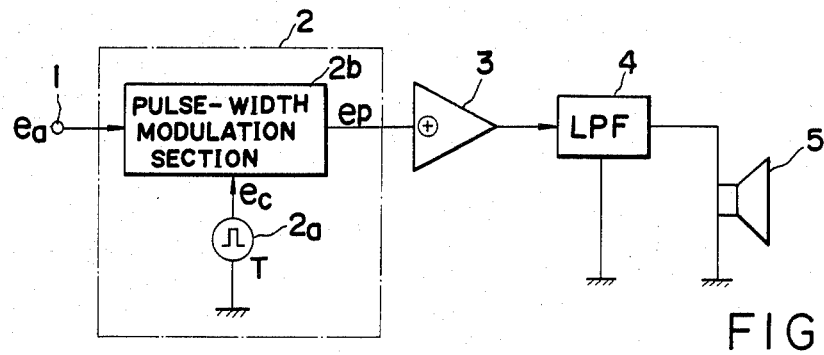
FIG. 1 is a block diagram illustrating one example of an amplifier using a prior art pulse-width modulation circuit.
Figure 2:
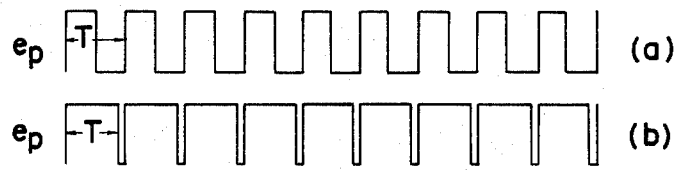
FIGS. 2 (a) and (b) are time charts for explaining the circuit operation of the prior art pulse-width modulation circuit.
Figure 3:
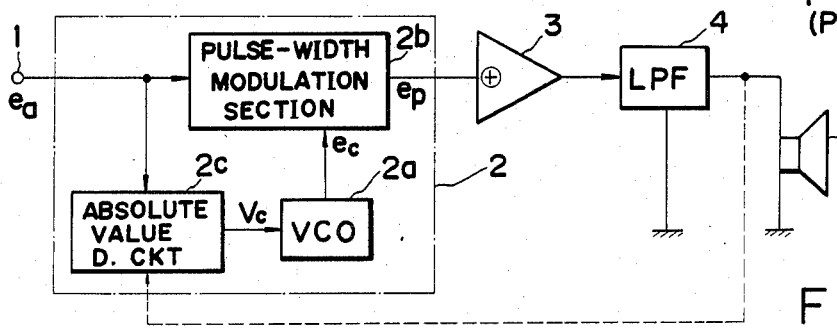
FIG. 3 is a block diagram showing a circuit construction of an amplifier using a first embodiment of the pulse-width modulation circuit according to the present invention FIGS. 4 (a) through (d) are time charts for explaining the circuit operation of the first embodiment.

FIG. 3 shows a block diagram illustrating a circuit construction of an amplifier wherein a first embodiment of the pulse-width modulation circuit according to the invention is incorporated therein. In the figure, an audio signal $e_a$ applied to an input terminal 1 is further delivered to a modulation section $2b$ and a level (absolute value) detector $2_c$. The level detector $2_c$ detects a signal level (amplitude) of the audio signal $e_a$ and generates a control voltage Vc corresponding to the audio signal level. The control voltage Vc is supplied to a control input terminal of a voltage-controlled oscillator (hereinafter referred to as VCO) $2a$. The VCO $2a$ generates a repetition signal such as a square wave signal which has a lower frequency as the control voltage Vc increases and has a higher frequency as the control voltage Vc decreases. The repetition signal delivered from the VCO $2a$ is supplied to the modulation section $2b$ as a carrier signal $e_c$. With this carrier signal $e_c$, the modulation section $2b$ converts the audio signal $e_a$ into a pulse signal $e_p$ having a duty factor corresponding to a signal level of the audio signal $e_a$. The pulse signal $e_p$ is in turn power-amplified at a pulse amplifier 3, and then is subjected to removal of the carrier signal $e_c$ components therefrom at a low-pass filter 4 in order to drive a loudspeaker 5. In this embodiment, the frequency of the square wave, while the control signal Vc is zero, is so determined to have the same order of frequency as the carrier signal $e_c$ of the conventional pulse-width modulation circuit.

Figure 4:
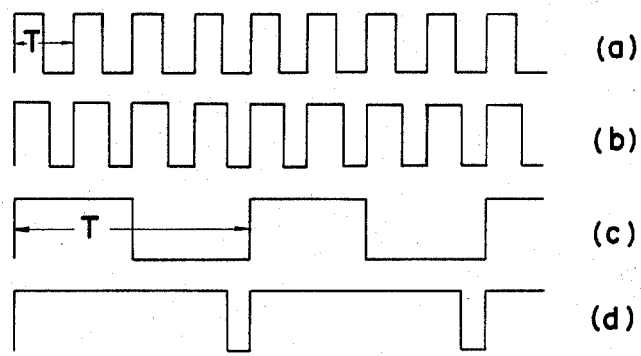

In the pulse-width modulation circuit 2 thus constructed, when the input signal level of the audio signal $e_a$ is low, e.g., at a 20% level of its maximum value, the control voltage Vc is also low. Accordingly, the frequency of the carrier signal $e_c$ has approximately the same order of frequency as the carrier signal $e_c$ of the conventional pulse-width modulation circuit. In this case, since the modulation factor of the carrier signal $e_c$ is also low, the duty factor of the pulse signal $e_p$ is about 50% so that the pulse signal $e_p$ has a relatively small amount of higher order harmonics (see FIG. 4 (b)). On the other hand, when the input signal level of the audio signal $e_a$ becomes high, e.g., at an 80% level of its maximum, the control voltage Vc becomes high, correspondingly. As a result, the frequency of the carrier signal $e_c$ becomes raordinarily low (or has a long period T), as shown in FIG. 4 (c). In this case, since the modulation factor of the carrier signal $e_c$ is high, the pulse signal $e_p$ is made to have a remarkably short, low level period when compared with the high level period, as shown in FIG. 4 (d) (or vice versa). Thus, during a high input level, it is seen that the short, low level period of the pulse signal $e_p$, as shown in FIG. 4 (d), is comparable to that of the pulse signal $e_p$ during a low input level shown in FIG. 4 (b). Therefore, the the amount of higher order harmonics of the pulse signal $e_p$ during a high input level can be made substantially the same as during a low input level.

As appreciated from the above embodiment, the band width required for the modulation section $2b$ and the pulse amplifier 3 and other associated circuitries can be narrowed to a large extent, and even with this narrower band width, more extensive improvement in distortion can be obtained than that of the prior art. In the embodiment shown in FIG. 3, the output from the low-pass filter 4 in lieu of the input signal $e_a$ can be alternatively supplied to the level detector $2c$, as shown in a line of short dashes.

The circuit theory of a pulse-width modulation of this type indicates the following facts: if it is assured that the duty factor of the pulse signal $e_p$ (output signal) is in correct proportion to the signal level of the audio signal $e_a$ (input signal), then the frequency variation of the carrier signal $e_c$ does not result in distortions. Therefore, it is not very important for the circuit to have a linear relation between the frequency of the carrier signal $e_c$ and the signal level of the input audio signal $e_a$. Considering the above, various relations between those two factors may be used, as long as the carrier frequency decreases with the increase of the input level of the audio signal $e_a$. A first relation is that the frequency of the carrier signal $e_c$ decreases linearly with the increase of the input level within the range where the input level is above a predetermined one, as shown by a solid line a in FIG. 5. A second relation is that the frequency of the carrier signal $e_c$ decreases linearly with the increase of the input level within a predetermined range, as shown by a line of alternate long and short dashes b in FIG. 5. A third relation is that the frequency of the carrier signal $e_c$ decreases non-linearly with the increase of the input level, as shown by a line of alternate long and two short dashes C in FIG. 5.

Figure 5:
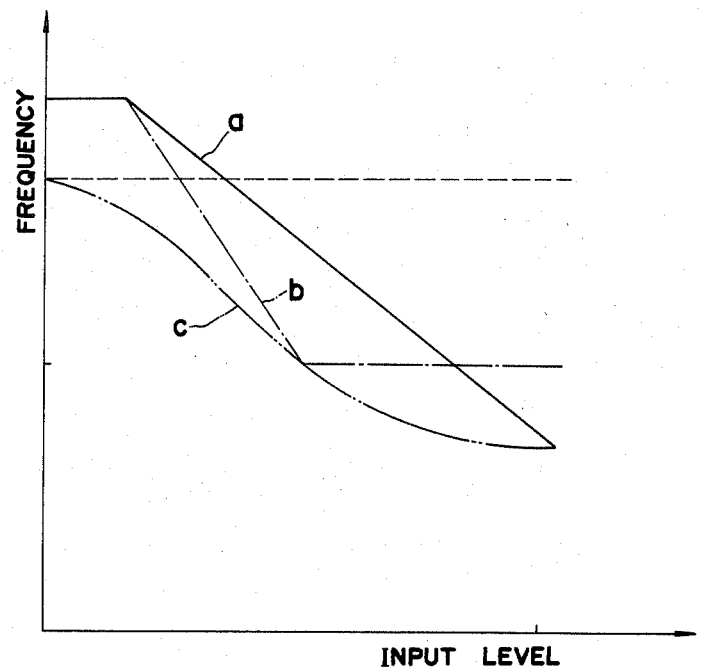
FIG. 5 is a graph showing some typical relations between the signal level of the input signal and the frequency of the output pulse signal.

A line of short dashes in FIG. 5 indicates a relation between the input audio signal level and the carrier signal frequency, having been used in the conventional pulse-width modulation circuit.

Figure 6:
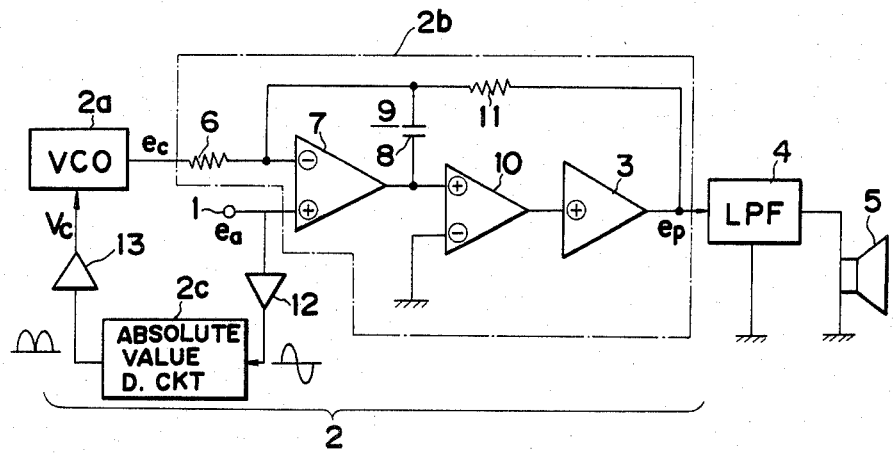
FIG. 6 is a schematic circuit diagram showing one concrete example of the first embodiment.

FIG. 6 shows a circuit diagram of one example of the more concrete circuits according to the first embodiment. In the figure, a modulation section $2b$ is a direct feedback type pulse-width modulation circuit well known in the art, in which a pulse-width modulated signal is directly fed back to the input side of the circuit. The modulation section $2b$ comprises a Miller integration circuit 9, made of resistor 6, a capacitor 8, and an operational amplifier 7, for integrating a carrier signal $e_c$ (square wave) from VCO $2a$, a comparator 10, a pulse amplifier 3, and a feedback resistor 11 connected between the inverting input terminal of the operational amplifier 7 and the output terminal of the pulse amplifier 3. An audio signal $e_a$ applied to an input terminal 1 is supplied to the non-inverting input terminal of the operational amplifier 7, and is also supplied to an absolute value detecting circuit $2c$ through a first buffer amplifier 12. The output from the absolute value detecting circuit $2_c$ is then supplied via a second buffer amplifier 13 to a control input terminal of the VCO $2a$, the output from the buffer amplifier 13 being a control voltage Vc proportional to the input signal level of the audio signal $e_a$.

It is seen from the circuit shown in FIG. 6 that an output pulse signal $e_p$ of the pulse-width modulation circuit 2 and hence of the pulse amplifier 3 has a duty factor and a frequency both varying in accordance with the input signal level of the audio signal $e_a$, thereby narrowing the band width of the circuitries concerned and attaining a distortion reduction.

Figure 7:
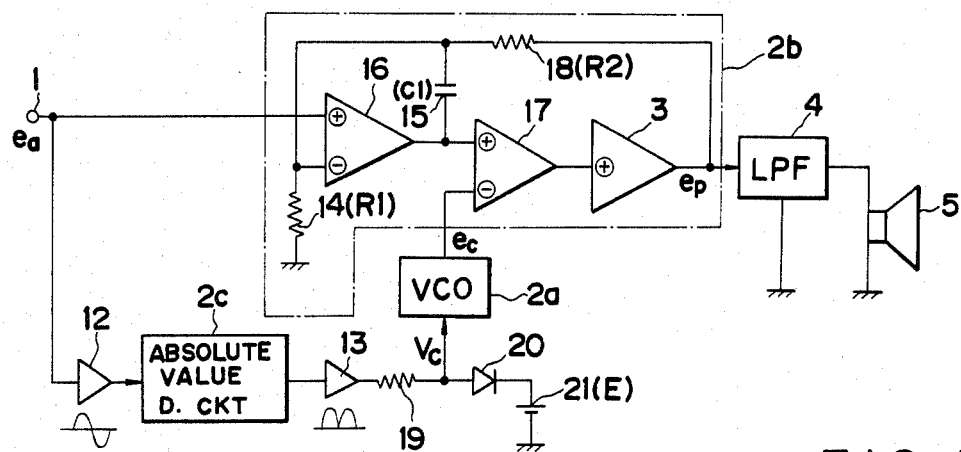
FIG. 7 is a schematic circuit diagram showing another concrete example of the first embodiment.

FIG. 7 shows a circuit diagram of another example of the concrete circuits according to the first embodiment. In the figure, a modulation section 2b comprises an operational amplifier 16, a comparator 17, and a pulse amplifier 3. The non-inverting input terminal of the operational amplifier 16 is supplied with an audio signal $e_a$ through an input terminal 1, and the inverting input terminal thereof is grounded through a resistor 14 (value R1). Between the inverting input terminal and the output terminal of the operational amplifier 16, a capacitor 15 (value C1) is provided. The comparator 17 is supplied with the output from the operational amplifier 16 at its non-inverting input terminal, and is supplied with a carrier signal $e_c$ from a VCO 2a at its inverting input terminal. The pulse amplifier 3 amplifies the output from the comparator 17, and feeds back a fraction of the output from the pulse amplifier 3 to the inverting input terminal of the operational amplifier 16 through a resistor 18 (value R2).

In the modulation section 2b thus constructed, since the carrier signal $e_c$ is applied to the inverting input terminal of the comparator 17, the output from the operational amplifier 16 has a triangular waveform. The rising and falling slopes of the triangular waveform varies oppositely with one another with respect to its gradient, and the amount of variation corresponds to the signal level of the audio signal $e_a$. Thus, an extremely precise pulse-width modulation is carried out independently of the waveform of the carrier signal $e_c$. The modulation section of this kind is shown in the disclosure of U.S. patent application Ser. No. 455,497 filed on Jan. 4, 1983, assigned to the same assignee of this invention, and incorporated herein by reference thereto.

In the circuit of FIG. 7, an absolute value detecting circuit 2c is provided which detects an absolute value of the voltage of an audio signal $e_a$ supplied from a buffer amplifier 12. The detected absolute value voltage is then amplified by a buffer amplifier 13, and thereafter is supplied as a control voltage Vc to a control input terminal of the VCO 2a through a resistor 19. Since the control input terminal of the VCO 2a is connected to the anode of a diode 20 whose cathode is supplied with a voltage E from a d.c. voltage source 21, the control voltage Vc never goes high above the voltage E even if the signal level of the audio signal $e_a$ increases higher than the voltage E.

From the concrete circuit of FIG. 7, it is seen that the duty factor and frequency of the output pulse signal $e_p$ are both changed in accordance with the input signal level of the audio signal $e_a$. The relation between the signal level of the audio signal $e_a$ and the frequency of the carrier signal $e_c$ may be shown as indicated by the alternate long and short dashes b of FIG. 5.

Figure 8:
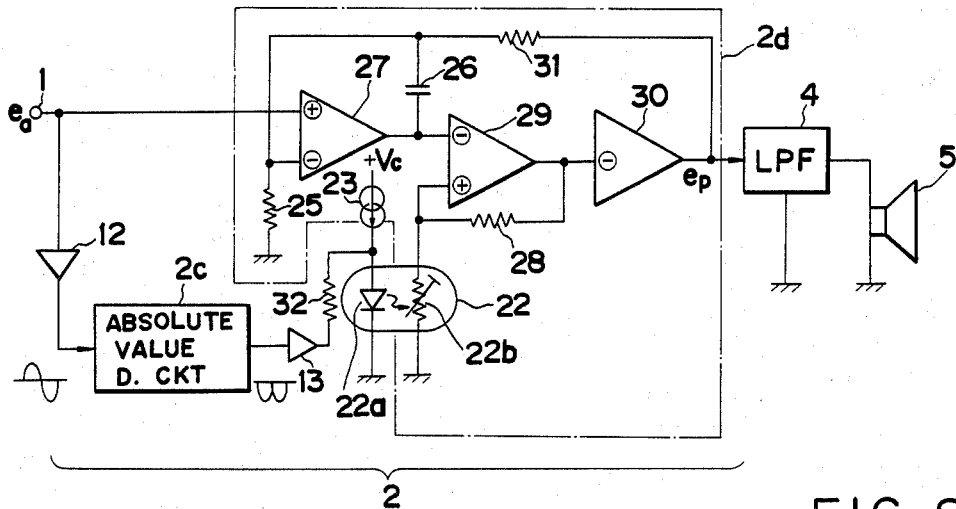
FIG. 8 is a schematic circuit diagram showing an amplifier using a second embodiment of the pulse-width modulation circuit according to the invention.

FIG. 8 shows a circuit diagram of an amplifier in accordance with a second embodiment of the invention. In the figure, a modulation section 2d is a self-oscillation type pulse-width modulation circuit well known in the line of art. A photo coupler generally designated by a reference number 22 comprises a light emitting diode 22a and a variable resistance element 22b of which the resistance value varies in accordance with the amount of light radiated from the diode 22a, the light emitting diode 22a being biased by a constant current circuit 23 to which a positive voltage +Vc is applied.

The modulation section 2d comprises an operational amplifier 27, a comparator 29, and a pulse amplifier 30. The non-inverting input terminal of the operational amplifier 27 is supplied with an audio signal $e_a$, and the inverting input terminal thereof is grounded through a resistor 25. Between the inverting input terminal and the output terminal of the operational amplifier 27, a capacitor 26 is connected. The comparator 29 is supplied with the output from the operational amplifier 27 at its inverting input terminal, and its non-inverting input terminal is grounded through the variable resistance element 22b, a resistor 28 being connected between the non-inverting input and output terminals. The pulse amplifier 30 inversely amplifies the output from the comparator 29. A resistor 31 is connected between the output of the pulse amplifier 30 and the inverting input terminal of the operational amplifier 27.

For the explanation of the operation of the modulation section 2d described above, it is assumed here that the audio signal $e_a$ is at a ground level, and the output of the comparator 29 is at a high level. In this condition, the output of the pulse amplifier 30 is made low so that the output voltage of the operational amplifier 27 rises with a time constant determined by the values of the resistor 31 and capacitor 26. When the output voltage of the operational amplifier 27 exceeds the voltage appearing at the non-inverting input terminal of the comparator 29, i.e., the voltage at the junction point between the resistor 28 and the variable resistance element 22b which constitute a positive feed back loop, then at that time instant the output voltage of the comparator 29 turns from a high level to a low level. Thus, the modulation section 2d continues to oscillate at a frequency which is determined by the values of the resistor 31 and capacitor 26 and the feedback amount of the positive loop constituted by the resistor 28 and the variable resistance element 22b. As a result, the rising and falling slopes of a triangular wave to be obtained at the output terminal of the operational amplifier 27 can be changed oppositely with each other with respect to its gradient, thereby performing a pulse-width modulation in a similar manner as described with FIG. 7.

In the meantime, the absolute value detecting circuit 2c coupled to the input terminal 1 via a buffer amplifier 12 outputs a negative voltage corresponding to the absolute value of the audio signal $e_a$. The negative voltage is amplified by a buffer amplifier 13, and the output of the buffer amplifier 13 is coupled to the anode of the diode 22a, thereby controlling a current flowing through the diode 22a. Since the current flowing through the diode 22a and the corresponding amount of light is decreased as the signal level of the audio signal $e_a$ increases, the resistance value of the variable resistance element 22b increases. Therefore, the degree of feedback in the comparator 29 determined by the combination of the resistor 28 and the variable resistance element 22b is enhanced, and hence lowers the oscillation frequency of the modulation section 2d.

It is seen also in the second embodiment that the duty factor and frequency of the output pulse signal $e_p$ are both changed in accordance with the signal level of the audio signal $e_a$.

It can be understood from the aforementioned embodiments that an absolute value detecting circuit is indispensable for obtaining an absolute value of the audio signal $e_a$, because it is a requisite for such a pulse-width modulation amplifier to lower the frequency of the carrier signal $e_c$ as the level of the audio signal $e_a$ goes from the zero level to either one of the positive or negative directions. Therefore, another type of a pulse-width modulation circuit is proposed in which a circuit for varying the carrier signal frequency in accordance with the audio signal level can be implemented with a low cost. Such embodiments will now be described in the following.

Figure 9:
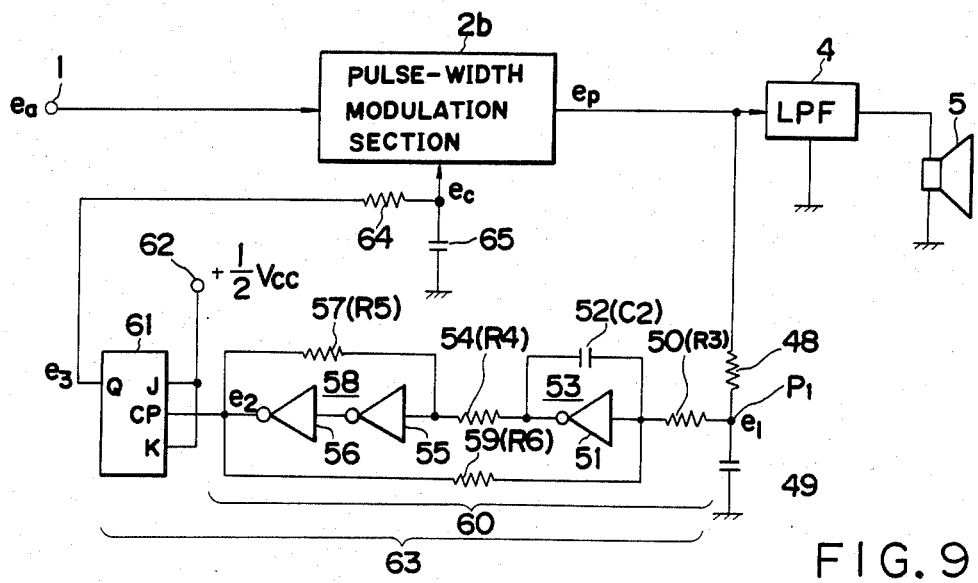
FIG. 9 is a schematic circuit diagram illustrating a third embodiment of the pulse-width modulation circuit according to the invention, in which a more simplified carrier signal generating circuit is employed.

FIG. 9 shows a circuit diagram illustrating an arrangement of a third embodiment of the pulse-width modulation circuit according to the invention. In the figure, corresponding parts to those in FIG. 3 have been designated by identical numbers and characters. The pulse-width modulation circuit of FIG. 9 uses a carrier signal having a triangular waveshape, the output terminal being grounded through a serially connected resistor 48 and capacitor 49 in this order. The combination of the resistor 48 and the capacitor 49 constitutes a filter circuit by which carrier signal components are removed from the output pulse signal $e_p$ of the pulse-width modulation section 2b. A junction point P1 between the resistor 48 and the capacitor 49 is connected through a resistor 50 (value R3) to the input terminal of an inverter 51. Between the output and input terminals of the inverter 51, a capacitor 52 (value C2) is coupled. The inverter 51 is supplied with source voltages $+Vcc/2$ and $-Vcc/2$. A circuit portion, including the resistor 50, inverter 51, and capacitor 52, constitutes a Miller integration circuit 53 which integrates a signal $e_1$ appearing at the junction point P1. The output terminal of the inverter 51 is connected through a resistor 54 (value R4) to the input terminal of an inverter 55, the output terminal thereof further being connected to the input terminal of an inverter 56, and a resistor 57 (value R5) being connected between the input terminal of the inverter 55 and the output terminal of the inverter 56. The inverters 55 and 56 are supplied with source voltages $+Vcc/2$ and $-Vcc/2$. A circuit portion, including the resistors 54 and 57, and the inverters 55 and 56, constitutes a hysteresis comparator 58 which has a hysteresis characteristic in operation and compares the output voltage of the Miller integration circuit 53 with two positive and negative voltages having the same absolute value. A resistor 59 (value R6) is coupled between the output terminal of the inverter 56 and the input terminal of the inverter 51. A whole circuit portion, including the Miller integration circuit 53, the hysteresis comparator 58, and the resistor 59, constitutes an oscillator section 60. The oscillation frequency Fos of the oscillator section 60 is $$Fos = \frac{R5}{4C2R4R6} \times \left\{ 1 - \left(\frac{2R6}{R3}\right)^2 \cdot \left(\frac{e_1}{Vcc}\right) \right\} \quad (1)$$

The output pulse signal $e_2$ of the oscillator section 60 has a duty factor of $$Dos = \frac{1}{2} - \frac{R6}{R3}\left(\frac{e_1}{Vcc}\right) \quad (2)$$

The output terminal of the inverter 56 and hence of the oscillator section 60 is connected to the clock input terminal of a JK flip-flop 61. The JK flip-flop 61 functions as a trigger flip-flop because of the connection of the J and K terminals to a common positive power source terminal 62 (supply voltage of $+Vcc/2$). The JK flip-flop 61 and the oscillator section 60 constitute a variable frequency oscillation circuit 63. The set output terminal Q of the JK flip-flop 61 is grounded through serially connected resistor 64 and capacitor 65 in this order. A signal appearing at a junction point of the resistor 64 and the capacitor 65 is supplied to the pulse-width modulation section 2b as a carrier signal $e_c$.

The operation of the above embodiment is as follows: The filter circuit made of the resistor 48 and the capacitor 49 removes carrier signal $e_c$ components from the output pulse signal $e_p$, and obtains a signal $e_1$ proportional to the audio signal $e_a$. The oscillator section 60 generates the pulse signal $e_2$ whose frequency Fos and duty factor Dos as defined in the equations (1) and (2) vary depending upon the voltage $e_1$. As seen from the equation (1), the frequency Fos of the pulse signal $e_2$ reaches a maximum value when the signal $e_1$ corresponding to signal $e_a$ is at a zero signal level, and decreases as the signal $e_1$ increases toward a positive or negative level. The duty factor Dos of the pulse signal $e_2$ also changes as shown in the equation (2), in accordance with the signal level of the signal $e_1$. However, since the pulse signal $e_2$ is frequency-divided at the JK flip-flop 61, the pulse signal $e_3$ delivered therefrom has a frequency of Fos/2 and a constant duty factor of 50%. The pulse signal $e_3$ is subjected to integration at the integration circuit made of the resistor 64 and the capacitor 65. Thus, according to the embodiment, a triangular wave signal for use as a carrier signal is obtained which has a maximum oscillation frequency when the audio signal $e_a$ is at a zero level and decreases its oscillation frequency as the audio signal $e_a$ increases its level toward a positive or negative direction.

It is appreciated that since the variable frequency oscillation circuit 63 can be implemented only by three inverters, one flip-flop, and resistors and capacitors, an extremely simple and low cost circuit arrangement can be accomplished. It may be possible to substitute operational amplifiers for the inverters 51, 55, and 56, however, in this case, since it is not important for the carrier signal $e_c$ to have a severe linearity in the pulse-width modulation circuit of this kind, it is more profitable to use inverters available at a lower price.

In the embodiment of FIG. 9, an audio signal $e_a$ of an output signal from the low-pass filter 4 may also be used as an input signal of the variable frequency oscillation circuit 63. In this case, the resistor 48 and capacitor 49 are removed as a matter of course.

Figure 10:
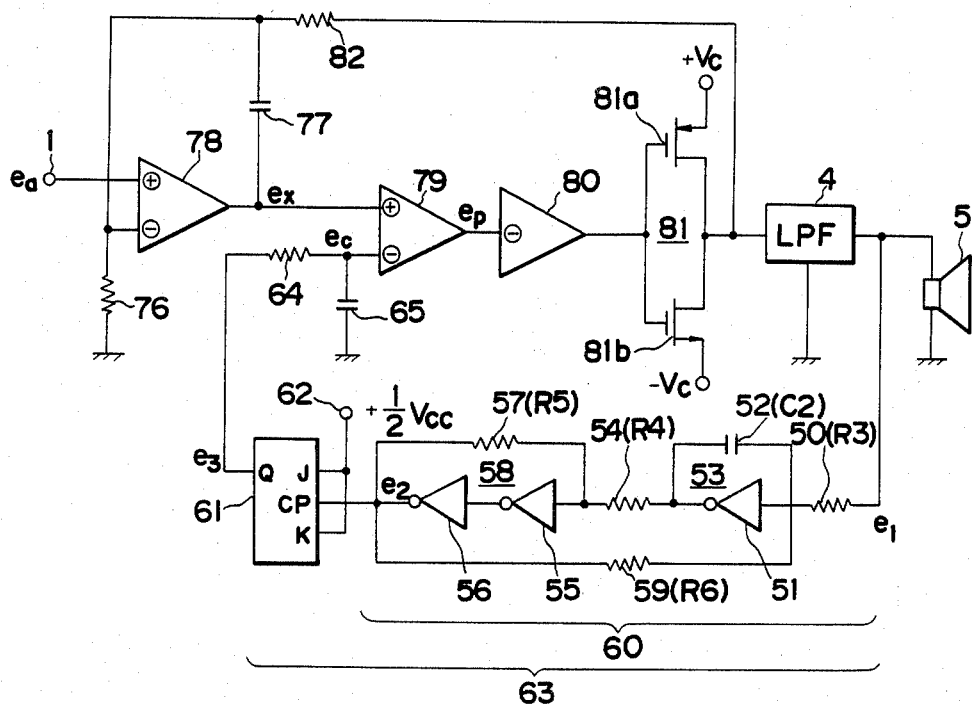
FIG. 10 is a schematic circuit diagram illustrating a concrete circuit arrangement of the third embodiment of FIG. 9.

FIG. 10 shows a circuit diagram illustrating a concrete circuit arrangement of the embodiment shown in FIG. 9. The pulse-width modulation circuit shown in FIG. 10 incorporates a similar variable frequency oscillation circuit of FIG. 9 and a direct feedback type pulse-width modulation circuit shown in FIG. 6, in which a carrier signal is applied within a feedback loop thereof.

The pulse-width modulation circuit shown in FIG. 10 comprises an operational amplifier 78, a comparator 79, a pulse amplifier 80, an output stage pulse amplifier circuit 81, and a variable frequency oscillation circuit 63. The operational amplifier 78 functions as an integration circuit in which the non-inverting input terminal is connected to a signal input terminal 1, the inverting input terminal is grounded through a resistor 76, and a capacitor 77 is connected between the output and inverting input terminals. The comparator 79 compares the voltage of the output signal $e_x$ of the operational amplifier 78 with the voltage of the carrier signal $e_c$. The pulse amplifier 80 inversely amplifies the pulse signal $e_p$ from the comparator 79, and drives the pulse amplifier circuit 81 comprising complementarily connected power field effect transistors 81a and 81b across positive and negative power supply voltages $+Vc$ and $-Vc$. The output from the pulse amplifier circuit 81 is fed back to the inverting input terminal of the operational amplifier 78 by way of a feedback resistor 82. The output from the pulse amplifier circuit 81 is demodulated at a low-pass filter 4 to energize a loudspeaker 5.

In the pulse-width modulation circuit described above, the signal $e_x$ is made to have a triangular wave having the same frequency as that of a carrier signal $e_c$. In addition, the gradients of the rising and falling slopes of the triangular wave are determined by a signal level of the audio signal $e_a$. As a result, the output pulse signal $e_p$ is obtained which has the same frequency as that of the carrier signal $e_c$ and has a duty factor corresponding to the level of the audio signal $e_a$. In this embodiment, the variable frequency oscillation circuit 63 receives an output signal $e_1$ (corresponding to an amplified audio signal $e_a$) from the low-pass filter 4, and generates an output pulse signal $e_3$. The pulse signal $e_3$ is then converted into a carrier signal $e_c$ of a triangular wave by means of an integration circuit comprising a resistor 64 and a capacitor 65. The carrier signal $e_c$ is supplied to the inverting input terminal of the comparator 79.

Figure 11:
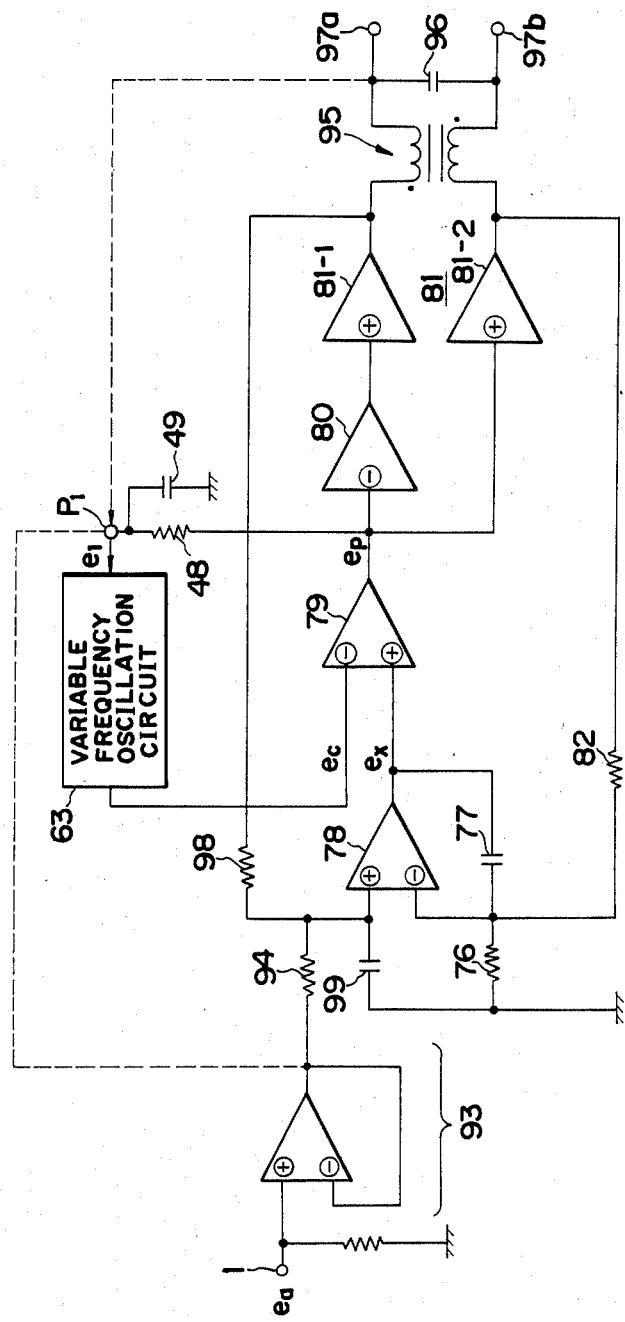
FIG. 11 is a schematic circuit diagram illustrating one modification of the circuit shown in FIG. 10.

FIG. 11 shows a modification of the pulse-width modulation circuit shown in FIG. 10. The pulse-width modulation circuit of FIG. 11 is of a direct feedback type similar to the embodiment of FIG. 10, and uses as an output stage a balanced transformer-less (BTL) type pulse amplifier circuit in order to improve a dissipation efficiency of power source.

In FIG. 11, an audio signal $e_a$ is applied through a voltage follower circuit 93 and through a resistor 94 to the non-inverting input terminal of an operational amplifier 78. The pulse amplifier circuit 81 of the output stage comprises pulse amplifier circuits 81-1 and 81-2 connected together in a BTL arrangement. The output signals from the pulse amplifier circuits 81-1 and 81-2 are respectively demodulated by a low-pass filter circuit comprising a transformer 95 and a capacitor 96, and thereafter are delivered to each of signal output terminals 97a and 97b. The demodulated signals opposite in phase to each other drives a load to be connected between the output terminals 97a and 97b.

A fraction of the output signal of the pulse amplifier circuit 81-1 is demodulated by an integration circuit comprising a resistor 98 and a capacitor 99, and the demodulated or non-pulsating signal is negative-fed back to the non-inverting input terminal of the operational amplifier 78. A fraction of the output of the pulse amplifier circuit 81-2 is directly fed back to the inverting input terminal of the operational amplifier or integrator 78 through a resistor 82, as is similar to the pulse-width modulation circuit shown in FIG. 10.

A variable frequency oscillation circuit 63 receives an input signal $e_1$ at its input terminal $P_1$. The input signal $e_1$ is obtained from a filter circuit comprising a resistor 48 and a capacitor 49, to which an output pulse signal $e_p$ from a comparator 79 is applied. Alternatively, the input signal may be a signal appearing at the output terminal 97a or 97b, or an output signal from the voltage follower circuit 93. The variable frequency oscillation circuit 63 generates a carrier signal $e_c$, e.g., a triangular wave signal whose frequency varies in accordance with the level of an audio signal $e_a$. The carrier signal $e_c$ is then applied to the inverting input terminal of the comparator 79.

What is claimed is:

1. A pulse-width modulation circuit comprising:
   pulse-width modulation means in which a carrier signal is pulse-width-modulated by an input signal to generate a pulse signal having a duty factor corresponding to a level of said input signal;
   level detecting means for detecting a level corresponding to said level of the input signal; and
   carrier signal generating means for generating said carrier signal for said pulse-width modulation means, said carrier signal having a frequency which deviates in accordance with the detected level of said level detecting means, the frequency of said carrier signal being decreased as said detected level increases.

2. A pulse-width modulation circuit as claimed in claim 1, wherein
   said pulse-width modulation means is comprised of a direct feedback type pulse-width modulation circuit in which said pulse-width-modulated carrier signal is directly fed back to an input side of said circuit; and
   said carrier signal generating means includes a voltage-controlled oscillator whose output is used as said carrier signal;
   and wherein an oscillation frequency of said voltage-controlled oscillator deviates in accordance with said detected level of said level detecting means.

3. A pulse-width modulation circuit as claimed in claim 1 wherein said pulse width modulation means and carrier signal generating means are combined in a self-oscillation type pulse-width modulation circuit having an oscillation frequency which deviates in accordance with said level of said level detecting means.

4. A pulse-width modulation circuit as claimed in claim 1, wherein said carrier signal generating means comprises:
   a Miller integrator whose input terminal is supplied with said detected level of said level detecting means;
   a hysteresis comparator whose input terminal is supplied with an output from said Miller integrator and having a comparator output a fraction of of said comparator output being fed back to said input terminal of said Miller integrator through a resistor;
   a flip-flop circuit which frequency-divides said comparator output; and
   an integrator circuit having an input terminal connected to an output of said flip-flop, and an integrator output which is supplied to said pulse-width modulation circuit as said carrier signal.

5. A pulse-width modulation circuit as claimed in claim 4, further comprising an integration circuit which integrates an output from said flip-flop circuit.

6. A pulse-width modulation circuit as claimed in claim 1, wherein said pulse signal is demodulated by a low-pass filter and is delivered to a load thereafter.

* * * * *